(12) United States Patent
Nakagawa et al.

(10) Patent No.: US 12,603,254 B2
(45) Date of Patent: Apr. 14, 2026

(54) ETCHING METHOD AND PLASMA PROCESSING APPARATUS

(71) Applicant: Tokyo Electron Limited, Tokyo (JP)

(72) Inventors: Akira Nakagawa, Miyagi (JP); Kenji Komatsu, Miyagi (JP); Kazuma Kamimura, Miyagi (JP); Tsukasa Hirayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 231 days.

(21) Appl. No.: 18/380,066

(22) Filed: Oct. 13, 2023

(65) Prior Publication Data

US 2024/0038501 A1     Feb. 1, 2024

Related U.S. Application Data

(63) Continuation of application No. PCT/JP2022/017522, filed on Apr. 11, 2022.

(30) Foreign Application Priority Data

Apr. 14, 2021     (JP) ................................. 2021-068571

(51) Int. Cl.
| | |
|---|---|
| *H01L 21/67* | (2006.01) |
| *H01J 37/32* | (2006.01) |
| *H01L 21/3065* | (2006.01) |
| *H01L 21/683* | (2006.01) |

(52) U.S. Cl.
CPC .. *H01J 37/32449* (2013.01); *H01J 37/32357* (2013.01); *H01L 21/3065* (2013.01); *H01L*

*21/67069* (2013.01); *H01L 21/6831* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 11,887,817 B2 * | 1/2024 | Nagami | ............ | H01J 37/32137 |
| 2017/0076945 A1 * | 3/2017 | Hudson | ............... | H01J 37/3244 |
| 2019/0067030 A1 * | 2/2019 | Saitoh | ............... | H01J 37/32165 |
| 2020/0357650 A1 * | 11/2020 | Takamatsu | .......... | H01L 21/3065 |
| 2023/0081817 A1 * | 3/2023 | Belau | ................ | H01J 37/32091 |
| | | | | 216/37 |

FOREIGN PATENT DOCUMENTS

| | | |
|---|---|---|
| JP | 2016-051750 A | 4/2016 |
| KR | 20160074397 A | 6/2016 |
| KR | 20200134070 A | 12/2020 |

OTHER PUBLICATIONS

International Search Report issued on Jun. 14, 2022 for WO 2022/220224 A1, 4 pages including English Translation.

* cited by examiner

*Primary Examiner* — Shamim Ahmed
(74) *Attorney, Agent, or Firm* — XSENSUS LLP

(57)     ABSTRACT

A substrate etching method performed by using a plasma processing apparatus includes: providing a substrate including a silicon-containing film to a substrate support; periodically supplying, to the substrate support, bias RF power of 20 KW to 50 kW at a duty ratio of 5% to 50%; and etching the silicon-containing film by plasma generated from a processing gas containing a fluorocarbon gas and an oxygen-containing gas.

16 Claims, 4 Drawing Sheets

| Conditions | (a) HF 6.5W/LF 13kW/DC 250V Duty 70%/19cycle | (b) HF 6.5W/LF 25kW/DC 250V Duty 35%/19cycle | (c) HF 8.5W/LF 25kW/DC 500V Duty 35%/18cycle |
|---|---|---|---|
| Ave.LER | 32. 6 | 9. 8 | 8. 6 |
| 3σ | 29. 2 | 6. 7 | 5. 7 |

ETCHING METHOD AND PLASMA PROCESSING APPARATUS

CROSS-REFERENCE TO RELATED APPLICATIONS

This application is a continuation application of International Patent Application No. PCT/JP2022/017522, filed on Apr. 11, 2022, which claims from Japanese Patent Application No. 2021-068571, filed on Apr. 14, 2021, all of each are incorporated herein in their entireties by reference.

TECHNICAL FIELD

The present disclosure relates to an etching method and a plasma processing apparatus.

BACKGROUND

Japanese Patent Laid-Open Publication No. 2016-051750 discloses a method of etching a first region including a multilayer film configured by alternately providing a silicon oxide film and a silicon nitride film, and a second region including a single-layer silicon oxide film. According to the etching method described in Japanese Patent Laid-Open Publication No. 2016-051750, a step of generating plasma of a first processing gas containing hydrofluorocarbon, and a step of generating plasma of a second processing gas containing fluorocarbon are performed alternately and repeatedly.

SUMMARY

According to an aspect of the present disclosure, a substrate etching method performed by using a plasma processing apparatus includes: (A) providing a substrate including a silicon-containing film to a substrate support; (B) periodically supplying, to the substrate support, bias RF power of 20 kW to 50 kW at a duty ratio of 5% to 50%; and (C) etching the silicon-containing film by plasma generated from a processing gas containing a fluorocarbon gas and an oxygen-containing gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
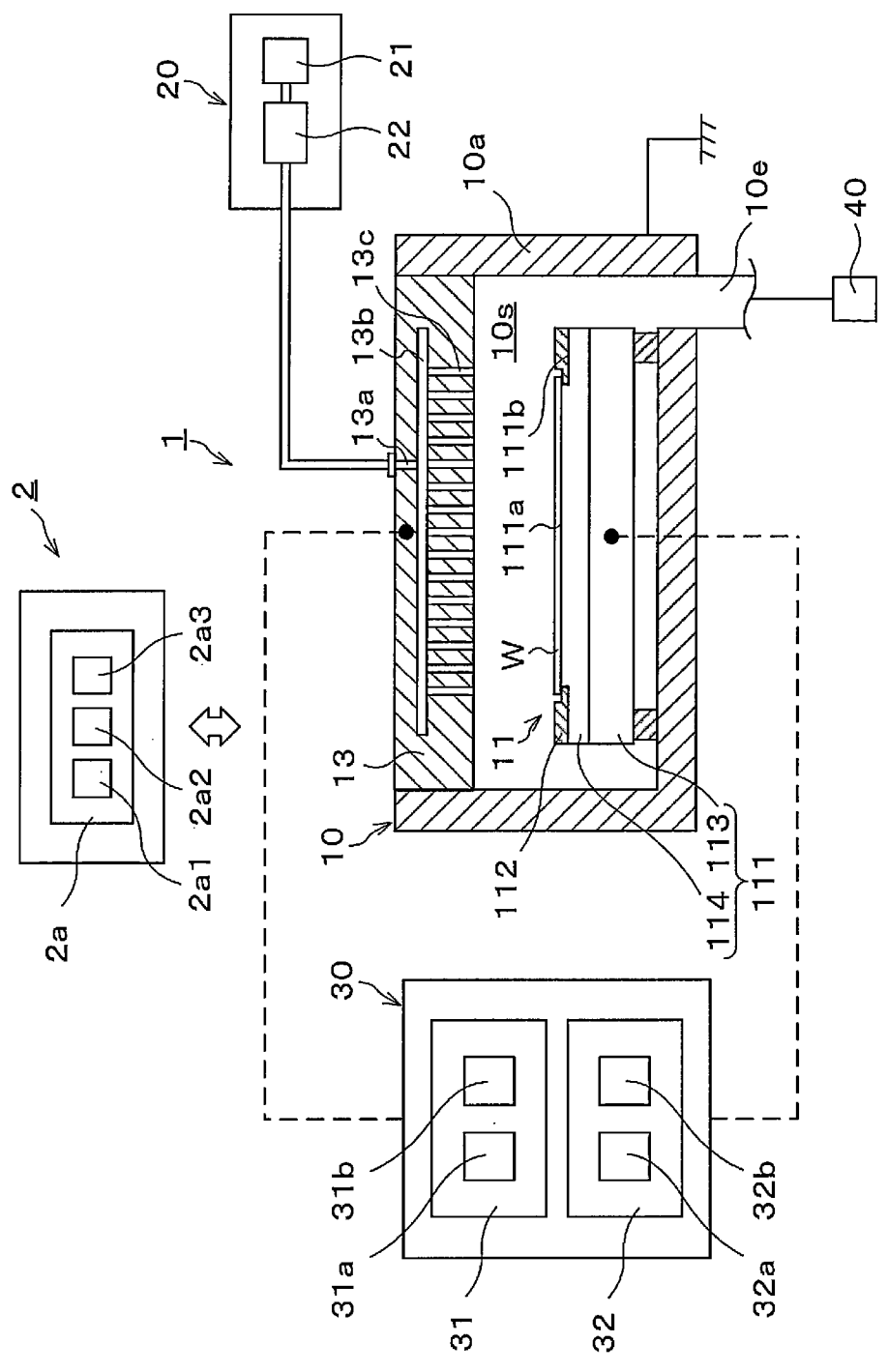
FIG. 1 is a vertical cross-sectional view schematically illustrating an example of the configuration of a plasma processing system.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

In the manufacturing process of semiconductor devices, an etching process is performed on an etching target layer stacked on the surface of a semiconductor substrate (hereinafter, simply referred to as a "substrate") by using a patterned mask layer as a mask. The etching process is generally performed by a plasma processing apparatus.

Japanese Patent Laid-Open Publication No. 2016-051750 discloses a method of performing etching on the etching target layer (the first region and the second region) by repeatedly performing a step of generating plasma of the hydrofluorocarbon-containing first processing gas, and a step of generating plasma of the fluorocarbon-containing second processing gas, within a processing container of the plasma processing apparatus. Further, in the etching method described in Japanese Patent Laid-Open Publication No. 2016-051750, during etching of the etching target layer, high frequency bias power of 1,000 W to 7,000 W is supplied to the lower electrode.

Meanwhile, in recent plasma processing apparatuses, in some cases, as the above-mentioned etching process, a 3D NAND high aspect ratio contact (HARC) process may be performed in which a deeply recessed hole is formed in the substrate on which the etching target layer is stacked. In the 3D NAND HARC process, with the recent demand for the higher capacity or the lower cost of devices, even higher stackability and higher integration are further required for the device structure. For this reason, in the etching pattern (a hole or a slit) formed by the etching process, there is a need to develop a technique of suppressing extremely small shape abnormalities that were not a problem in a conventional technique, for example, a minute roughness (LER: line edge roughness) occurring on the side wall surface of the etching pattern.

The technology according to the present disclosure has been made in view of the above circumstances, and improves the shape abnormality of the etching pattern formed on the substrate during the etching process. Hereinafter, descriptions will be made on a plasma processing system according to one embodiment, and an etching method according to the present embodiment, with reference to drawings. In the specification and the drawings, elements having substantially the same functional configuration are denoted by the same reference numerals and redundant explanations will be omitted.

<Plasma Processing System>

First, a plasma processing system according to one embodiment will be described. FIG. 1 is a vertical cross-sectional view illustrating the outline of the configuration of a plasma processing system.

The plasma processing system includes a capacitively coupled plasma processing apparatus 1 and a control unit 2. The plasma processing apparatus 1 includes a plasma processing chamber 10, a gas supply unit 20, a power supply 30 and an exhaust system 40. Further, the plasma processing apparatus 1 includes a substrate support 11 and a gas introduction unit. The substrate support 11 is disposed within the plasma processing chamber 10. The gas introduction unit is configured to introduce at least one processing gas into the plasma processing chamber 10. The gas introduction unit includes a shower head 13. The shower head 13 is disposed above the substrate support 11. In one embodiment, the shower head 13 forms at least a part of the ceiling of the plasma processing chamber 10. Inside the plasma processing chamber 10, a plasma processing space 10s defined by the shower head 13, a side wall 10a of the plasma processing chamber 10 and the substrate support 11 is formed. The plasma processing chamber 10 has at least one gas supply port for supplying at least one processing gas to the plasma processing space 10s, and at least one gas outlet for exhausting gas from the plasma processing space 10s. The side wall 10a is grounded. The shower head 13 and the substrate support 11 are electrically insulated from the plasma processing chamber 10.

The substrate support 11 includes a body member 111 and a ring assembly 112. The top surface of the body member 111 has a central region 111a (a substrate supporting surface) for supporting a substrate (wafer) W, and an annular region 111b (a ring supporting surface) for supporting the ring assembly 112. In plan view, the annular region 111b surrounds the central region 111a. The ring assembly 112 includes one or more annular members, and at least one of one or more annular members is an edge ring.

In one embodiment, the body member 111 includes a base 113 and an electrostatic chuck 114. The base 113 includes a conductive member. The conductive member of the base 113 functions as a lower electrode. The electrostatic chuck 114 is disposed on the top surface of the base 113. The top surface of the electrostatic chuck 114 has the central region 111a and the annular region 111b.

Further, the substrate support 11 may include a temperature control module configured to control at least one of the ring assembly 112, the electrostatic chuck 114 and the substrate W, to a target temperature, but the illustration thereof is omitted. The temperature control module may include a heater, a heat transfer medium, a flow path, or a combination thereof. A heat transfer fluid such as brine or gas flows through the flow path. Further, the substrate support 11 may include a heat transfer gas supply unit that supplies a heat transfer gas (back side gas) between the back surface of the substrate W and the top surface of the electrostatic chuck 114.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a is introduced into the plasma processing space 10s from the plurality of gas introduction ports 13c through the gas diffusion chamber 13b. Further, the shower head 13 includes a conductive member such as silicon or silicon carbide. The conductive member of the shower head 13 functions as an upper electrode. In addition to the shower head 13, the gas introduction unit may include one or more side gas injectors (SGIs) attached to one or more openings formed in the side wall 10a.

The gas supply unit 20 may include at least one gas source 21 and at least one flow controller 22. In one embodiment, the gas supply unit 20 is configured to supply at least one processing gas to the shower head 13 from each corresponding gas source 21 through each corresponding flow controller 22. Each flow controller 22 may include, for example, a mass flow controller or a pressure control-type flow controller. Further, the gas supply unit 20 may include one or more flow modulation devices that modulate the flow rate of at least one processing gas or make a pulse of the flow rate.

The power supply 30 includes an RF power supply 31 coupled to the plasma processing chamber 10 via at least one impedance matching circuit. The RF power supply 31 is configured to supply at least one RF signal (RF power), such as a source RF signal and a bias RF signal, to the conductive member of the substrate support 11 and/or the conductive member of the shower head 13. Accordingly, plasma is formed from at least one processing gas supplied to the plasma processing space 10s. Therefore, the RF power supply 31 may function as at least a part of a plasma generator configured to generate plasma from one or more processing gases in the plasma processing chamber 10. Further, when a bias RF signal is supplied to the lower electrode, a bias potential is generated in the substrate W, and ion components in the formed plasma may be drawn into the substrate W.

In one embodiment, the RF power supply 31 includes a first RF generator 31a and a second RF generator 31b. The first RF generator 31a is coupled to the conductive member of the substrate support 11 and/or the conductive member of the shower head 13 via at least one impedance matching circuit, and is configured to generate a source RF signal (source RF power) for plasma generation. In one embodiment, the source RF signal has a frequency within a range of 13 MHz to 150 MHz. In one embodiment, the first RF generator 31a may be configured to generate source RF signals having different frequencies. One or more generated source RF signals are supplied to the lower electrode or the upper electrode. The second RF generator 31b is coupled to the lower electrode via at least one impedance matching circuit, and is configured to generate a bias RF signal (bias RF power). In one embodiment, the bias RF signal has a lower frequency than the source RF signal. In one embodiment, the bias RF signal has a frequency within a range of 400 kHz to 13.56 MHz. In one embodiment, the second RF generator 31b may be configured to generate bias RF signals having different frequencies. One or more generated bias RF signals are supplied to the lower electrode. Further, in various embodiments, at least one of the source RF signal and the bias RF signal may be pulsed.

In one embodiment, the second RF generator 31b may supply bias RF signals (bias RF power) to the lower electrode by ON/OFF control. Under the ON/OFF control, a first period (ON period) during which the bias RF signal (bias RF power) is supplied to the lower electrode and a second period (OFF period) during which the supply of the bias RF signal (bias RF power) is stopped are periodically repeated. Otherwise, in one embodiment, the second RF generator 31b may supply bias RF signals (bias RF power) to the lower electrode by High-Low control. Under the High-Low control, a first period (High period) during which the high-level bias RF signal (bias RF power) is supplied to the lower electrode, and a second period (Low period) during which the low-level bias RF signal (bias RF power) is supplied are periodically repeated.

In the following description, a "duty ratio" refers to the proportion occupied by the first period (first period/(first period+second period)) within one cycle (the total time of the first period and the second period) during which the bias RF signal (bias RF power) is supplied. More specifically, when the ON/OFF control is performed on the supply of the bias RF signal (bias RF power), [ON period/(ON period+OFF period)] is referred to as the duty ratio, and when the High-Low control is performed, [High period/(High period+Low period)] is referred to as the duty ratio.

Further, the power supply 30 may include a DC power supply 32 coupled to the plasma processing chamber 10. The DC power supply 32 includes a first DC generator 32a and a second DC generator 32b. In one embodiment, the first DC generator 32a is connected to the lower electrode, and is configured to generate a first DC signal. The generated first bias DC signal is applied to the lower electrode. In one embodiment, the first DC signal may be applied to another electrode, such as an electrode within the electrostatic chuck. In one embodiment, the second DC generator 32b is connected to the upper electrode, and is configured to generate a second DC signal. The generated second DC signal is applied to the upper electrode. In various embodiments, at least one of the first and second DC signals may be pulsed. In the present embodiment, the first and second DC generators 32a and 32b may be provided in addition to the RF power supply 31, and the first DC generator 32a may be provided instead of the second RF generator 31b.

The exhaust system 40 may be connected to, for example, a gas outlet 10e provided at the bottom of the plasma processing chamber 10. The exhaust system 40 may include a pressure regulation valve and a vacuum pump. By the pressure regulation valve, the pressure within the plasma processing space 10s is adjusted. The vacuum pump may include a turbomolecular pump, a dry pump or a combination thereof.

The control unit 2 processes computer-executable instructions that cause the plasma processing apparatus 1 to execute various steps described in the present disclosure. The control unit 2 may be configured to control each element of the plasma processing apparatus 1 so as to execute various steps described herein. In one embodiment, a part or all of the control unit 2 may be included in the plasma processing apparatus 1. The control unit 2 may include, for example, a computer 2a. The computer 2a may include, for example, a processor (CPU: central processing unit) 2a1, a storage 2a2, and a communication interface 2a3. The processor 2a1 may be configured to perform various control operations on the basis of the program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

As above, although various embodiments have been described, the present disclosure is not limited to the embodiments described above, and various additions, omissions, substitutions, and modifications may be made. Further, elements in different embodiments may be combined to form other embodiments.

For example, in the present embodiment, a case where the plasma processing system has the capacitively coupled plasma (CCP) processing apparatus 1 has been described as an example, but the configuration of the plasma processing system is not limited to this. For example, the plasma processing system may have a processing apparatus including a generator for plasma such as inductively coupled plasma (ICP), electron-cyclotron-resonance plasma (ECR plasma), helicon wave-excited plasma (HWP), or surface wave plasma (SWP). Further, a processing apparatus including various types of plasma generators, including an alternating current (AC) plasma generator and a direct current (DC) plasma generator, may be used.

<Plasma Processing Method>

Next, descriptions will be made on an etching process for the substrate W according to the technique of the present disclosure, which is performed using the plasma processing apparatus 1 configured as described above.

The etching process of the present embodiment is applied to a substrate including a base layer, and an etching target layer formed on the base layer. The base layer is, for example, a silicon nitride film. The etching target layer is, for example, a silicon-containing film. The silicon-containing film may be at least one type selected from the group including a silicon oxide film, a silicon nitride film, and a polysilicon film. A mask layer may be formed on the etching target layer. The mask layer may be composed of at least one type selected from the group including an organic film and a boron-containing film. Examples of the organic film include photoresist, spin-on carbon, tungsten carbide, and amorphous carbon. Examples of the boron-containing film include boron nitride and boron carbide.

Figure 2:
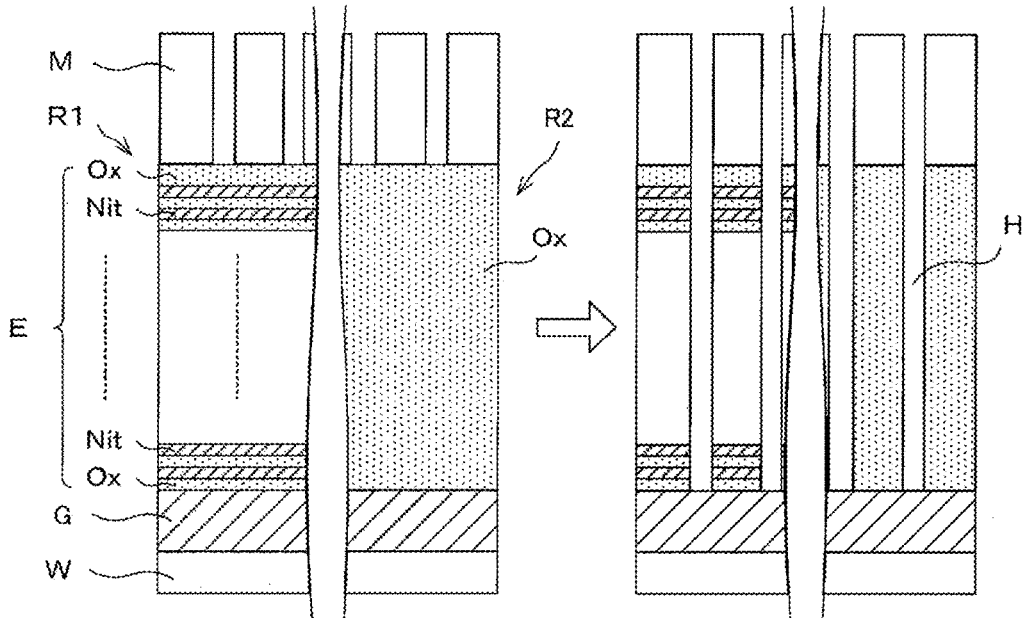
FIGS. 2A and 2B are explanatory diagrams illustrating an example of an etching target layer formed on the surface of a substrate.

FIG. 2A is a view illustrating an example of the substrate W to which the etching process of the present embodiment is applied. The substrate W includes a base layer G, an etching target layer E provided on the base layer G, and a mask layer M provided on the etching target layer. In the example illustrated in FIG. 2A, the etching target layer E includes a first region R1 and a second region R2. Both the first region and the second region are silicon-containing films. The first region R1 is a multilayer film ON in which at least two types of films selected from the silicon-containing films, a silicon oxide film Ox, and a silicon nitride film Nit in the illustrated example, are alternately stacked. Further, the second region R2 is a single-layer silicon oxide film Ox.

In the present embodiment, as illustrated in FIG. 2B, a trench hole H, which is an etching pattern with a high aspect ratio, is formed in the etching target layer E through the etching process. The etching process of the present embodiment includes steps S1 to S4.

In step S1, the substrate W is carried into the plasma processing chamber 10, and the substrate W is placed on the substrate support 11. Thereafter, a DC voltage is supplied to the electrostatic chuck 114 so that the substrate W is attracted and held by the electrostatic chuck 114. When the substrate W is held by the electrostatic chuck 114, the exhaust system 40 reduces the pressure within the plasma processing chamber 10 to a desired degree of vacuum.

In step S2, first, a processing gas is supplied from the gas supply unit 20 to the plasma processing space 10s via the shower head 13. Further, the source RF power is supplied to the lower electrode by the first RF generator 31a, so that the processing gas is excited to generate plasma. Furthermore, the bias RF power is periodically supplied to the lower electrode by the second RF generator 31b. As described above, the supply of the bias RF power from the second RF generator 31b to the lower electrode may be performed by the ON/OFF control or the High-Low control under which the first period and the second period are periodically repeated. Then, through the action of the generated plasma, the etching process is performed on the etching target layer E formed on the substrate W.

In the present embodiment, the frequency that defines the cycle during which the bias RF power is supplied in step S2 may be 1 kHz to 10 kHz.

The magnitude of the bias RF power is controlled to 20 kW to 50 kW, preferably 23 kW to 40 kW. By setting the magnitude of the bias RF power to 20 kW or more, it is possible to increase the vertical components of ions entering the trench hole H during the etching process, and by setting the magnitude to 50 kW or less, it is possible to suppress a decrease in the selectivity of the mask.

Further, the duty ratio, which is a proportion occupied by the period (the first period) when the bias RF power is supplied, or the period when the high-level bias RF power is supplied, within one cycle (the first period+second period) is controlled to be 5% to 50%, preferably 10% to 40%. Accordingly, it is possible to increase the amount of negative ions drawn into the substrate W (trench hole H) during the period when the bias RF power is not supplied, so that charging is reduced. Therefore, during the period when the bias RF power is supplied, it is possible to increase the vertical components of ions entering the trench hole H. Further, when the duty ratio is controlled to be 5% or more, it is possible to suppress the time during which the bias RF power is supplied from becoming extremely short, and as a result, it is possible to suppress a decrease of the etching rate or throughput.

In this way, by supplying the bias RF power of 20 kW to 50 kW at a duty ratio of 5% to 50%, damage to the side wall of the trench hole H is suppressed, so that LER may be improved.

In step S2, the processing gas includes at least one type of carbon-containing gas selected from the group including a fluorocarbon gas and a hydrofluorocarbon gas, and an oxygen-containing gas. The fluorocarbon gas may be at least one type selected from the group including $C_4F_6$ gas, $C_4F_8$ gas and $C_3F_8$ gas. The hydrofluorocarbon gas may be at least one type selected from the group including $CH_2F_2$ gas, $CHF_3$ gas and $CH_3F$ gas. The oxygen-containing gas may be at least one type selected from the group including $O_2$ gas, CO gas and $CO_2$ gas. Further, the processing gas may further contain another gas. For example, at least one type of gas selected from the group including COS gas, $NF_3$ gas and $SF_6$ gas may be contained.

As illustrated in FIG. 2A, when the etching process is performed on the substrate W in which the etching target layer E has the first region R1 and the second region R2, step S2 may include steps S21 to S22 to be described below. In this case, the bias RF power in step S21 and step S22 may be set in the same manner as the bias RF power in step S2. Further, as for a first processing gas in step S21 and a second processing gas in step S22, gases exemplified as the processing gas in step S2 may be used.

In step S21, the etching target layer E is etched by plasma generated from the first processing gas containing the fluorocarbon gas, the hydrofluorocarbon gas and the oxygen-containing gas. In step S21, conditions that do not increase the critical dimension (CD) value indicating the width of the trench hole H formed in the etching target layer E are selected. Specifically, the flow rates of the oxygen-containing gas and the fluorocarbon gas contained in the first processing gas are selected such that the flow rate ratio of the fluorocarbon gas to the oxygen-containing gas is larger than 1.0. Under these conditions, a polymer containing fluorocarbon is deposited on the side wall of the trench hole H, and functions as a protective film, thereby suppressing the increase of the CD value.

Further, the first processing gas used in step S21 is set to have a higher flow rate ratio of fluorocarbon gas to hydrofluorocarbon gas than the second processing gas used in step S22 to be described below. The plasma generated from the fluorocarbon gas has a higher etching rate for the silicon oxide film Ox, than for the silicon nitride film Nit. Therefore, the etching rate of plasma generated from the first processing gas on the second region R2 is higher than the etching rate of plasma generated from the first processing gas on the first region R1. Thus, in step S21, the second region R2 is preferentially etched over the first region R1.

Hereinafter, various etching process conditions in step S21 (a first etching process) are exemplified. The process conditions illustrated below are all examples, and process conditions for the first etching process may be freely selected.

First processing gas
Flow rate of fluorocarbon gas: 50 to 200 sccm
Flow rate of hydrofluorocarbon gas: 50 to 200 sccm
Flow rate of oxygen-containing gas: 50 to 200 sccm
Source RF power: 6,000 to 8,000 W
Bias RF power: 20 kW to 50 kW (e.g., 25 kW)
Duty ratio of bias RF power: 5% to 50% (e.g., 35%)
Pressure of plasma processing chamber: 20 to 100 mT
Processing time: 20 to 90 sec.

In step S22, the etching target layer E is etched by plasma generated from the second processing gas containing the fluorocarbon gas, the hydrofluorocarbon gas and the oxygen-containing gas. In step S22, conditions that increase the CD value of the trench hole H formed in the etching target layer E are selected. Specifically, the flow rate ratio of the oxygen-containing gas and the fluorocarbon gas contained in the second processing gas is selected such that the flow rate ratio of the fluorocarbon gas to the oxygen-containing gas is 1.0 or less. Under these conditions, the polymer deposited on the side wall of the trench hole H is removed by the plasma generated from the oxygen-containing gas, and etching progresses not only in the depth direction of the trench hole H but also in the width direction (the direction perpendicular to the depth direction). Thus, the CD value is increased.

Further, the second processing gas used in step S22 is set to have a lower flow rate ratio of fluorocarbon gas to hydrofluorocarbon gas than the first processing gas used in step S21. The plasma generated from the hydrofluorocarbon gas has a higher etching rate for the silicon nitride film Nit, than for the silicon oxide film Ox. Therefore, the etching rate of plasma generated from the second processing gas on the first region R1 is higher than the etching rate of plasma generated from the second processing gas on the second region R2. Thus, in step S22, the first region R1 is preferentially etched over the second region R2.

Hereinafter, various etching process conditions in step S22 (a second etching process) are exemplified. The process conditions illustrated below are all examples, and process conditions for the second etching process may be freely selected.

Second processing gas
Flow rate of fluorocarbon gas: 40 to 100 sccm
Flow rate of hydrofluorocarbon gas: 40 to 100 sccm
Flow rate of oxygen-containing gas: 40 to 100 sccm
Source RF power: 6,000 to 8,000 W
Bias RF power: 20 kW to 50 kW (e.g., 25 kW)
Duty ratio of Bias RF power: 5% to 50% (e.g., 35%)
Pressure of plasma processing chamber: 20 to 100 mT
Processing time: 10 to 30 sec
Step S21 and step S22 may be alternately repeatedly performed. In this case, a difference is suppressed from occurring between the etching rate of the first region R1 and the etching rate of the second region R2. That is, a difference is appropriately suppressed from occurring between the depth of the trench hole H formed in the first region R1, and the depth of the trench hole H formed in the second region R2.

Further, the processing time of step S21 and the processing time of step S22 are appropriately adjusted according to, for example, the type or thickness of a film to be etched. As an example, the ratio of the processing time of step S22 (the second etching process) to the processing time of step S21 (the first etching process) is adjusted to 2 to 3.

In step S2 (step S21 and step S22) according to the present embodiment, a negative DC voltage may be periodically applied from the second DC generator 32b to the upper electrode facing the substrate support 11. Accordingly, positive ions existing in the plasma processing space 10s collide with the upper electrode, and secondary electrons are emitted from the upper electrode. The substrate W is irradiated with the emitted secondary electrons so that the mask layer M is modified. Further, when the upper electrode contains silicon, as the positive ions collide with the upper electrode, silicon atoms are emitted together with the secondary electrons. These silicon atoms react with excess fluorine atoms in the plasma processing space $10s$ or on the substrate W through the following reaction illustrated in (1), thereby removing excess fluorine atoms. As a result, the mask layer M is suppressed from being damaged by the etching process, so that LER of the trench hole H may be further improved.

$$Si+4F \rightarrow SiF_4 \uparrow \tag{1}$$

This DC voltage may be controlled such that a first voltage is applied during the first period when the bias RF power is supplied to the substrate support 11 or the high-level bias RF power is supplied within one cycle, and a second voltage having a different magnitude from the first voltage is applied during the second period when the bias RF power is not supplied to the substrate support 11 or the low-level bias RF power is supplied within one cycle. The absolute value of the second voltage may be higher than the absolute value of the first voltage. As an example, the absolute value of the first voltage may be 250 to 500 V. Further, the absolute value of the second voltage may be 1,000 V or more.

After step S2 (step S21 and step S22), as step S3, a step of determining whether the etching process in step S2 satisfies a predetermined processing termination condition set in advance may be included. If the predetermined condition is satisfied, the etching process for the substrate W is ended. Meanwhile, if the predetermined condition is not satisfied, step S2 is performed on the substrate W again. The predetermined condition may be the processing time or the depth of the trench hole H formed by the etching process. Further, when step S21 and step S22 are repeatedly executed as step S2, the predetermined condition may be the number of repetitions of step S21 and step S22.

When step S2 or step S3 is completed, the etching process in the plasma processing apparatus 1 is ended. When the etching process is ended, first, the supply of the source RF power and the bias RF power from the RF power supply 31, the application of the DC voltage from the DC power supply 32, and the supply of the processing gas by the gas supply unit 20 are stopped. Next, the supply of the heat transfer gas to the back surface of the substrate W is stopped, and attraction-holding of the substrate W by the electrostatic chuck is stopped.

Figure 3:
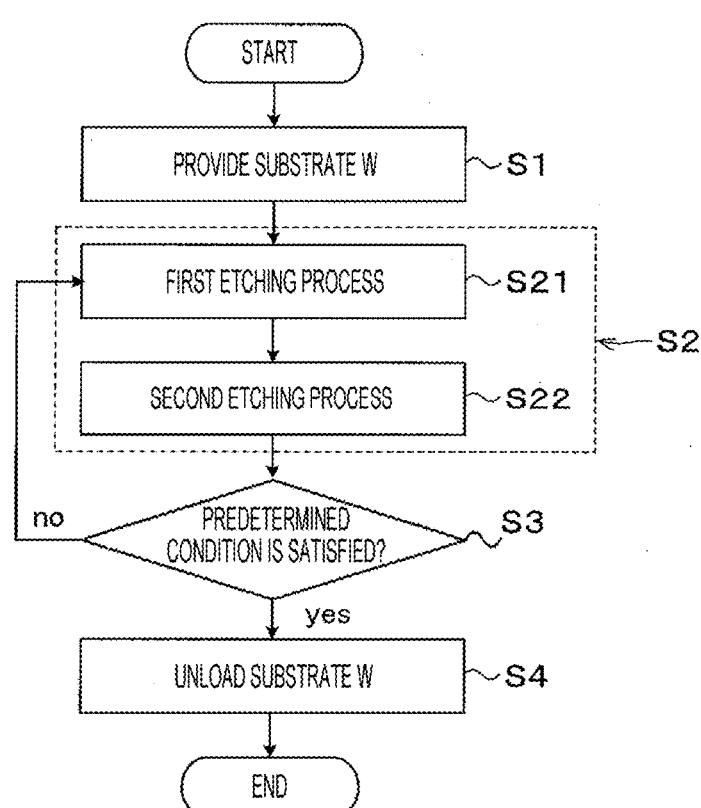
FIG. 3 is a flowchart illustrating steps of plasma processing according to one embodiment.

After that, the substrate W on which the etching process has been performed is unloaded by a substrate transfer mechanism (not illustrated) from the plasma processing chamber 10 (step S4 of FIG. 3: unloading of the substrate W), and a series of plasma processes for the substrate W is ended.

EXAMPLES

Figure 4:
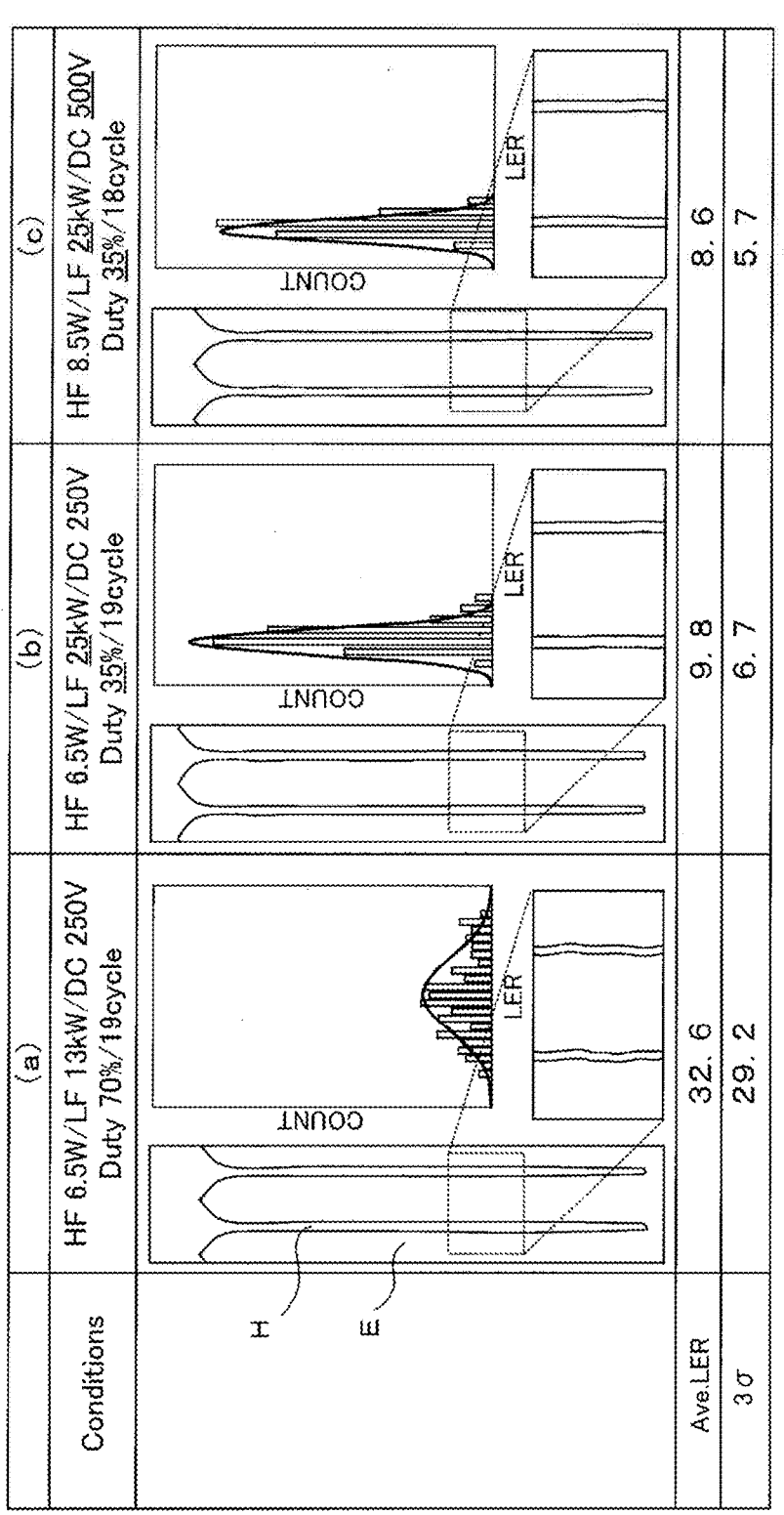
FIG. 4 is an explanatory diagram illustrating an example of etching process results according to Examples.

FIG. 4 is an explanatory diagram illustrating an example of etching process results according to Examples. Part (a) of FIG. 4 is a view illustrating each of the average value of LER of the trench hole H and the deviation value (36) of LER in a reference example, that is, in a case where bias RF power of 13 kW was supplied to the substrate support 11 at a duty ratio of 70%, and a DC voltage of –250 V was applied to the upper electrode. Part (b) of FIG. 4 is a view illustrating each of the average value of LER of the trench hole H and the deviation value (36) of LER in Example 1, that is, in a case where bias RF power of 25 kW was supplied to the substrate support 11 at a duty ratio of 35%, and a DC voltage of –250 V was applied to the upper electrode. Part (c) of FIG. 4 is a view illustrating each of the average value of LER of the trench hole H and the deviation (36) of LER in Example 2, that is, in a case where bias RF power of 25 kW was supplied to the substrate support 11 at a duty ratio of 35%, and a DC voltage of –500 V was applied to the upper electrode.

Other conditions (supply conditions of source RF power or the number of cycles, etc.) in the etching process are as illustrated in FIG. 4.

As illustrated in FIG. 4, the shape of the trench hole H is better in Examples 1 and 2 than in the reference example. Specifically, it may be found that the average value of LER (Ave. LER) and the deviation (36) of LER are decreased, and the roughness of the trench hole H is decreased. It is thought that this is because damage to the side wall of the trench hole H is suppressed by increasing the bias RF power, decreasing the duty ratio, and increasing vertical components of ions entering the trench hole H as described above.

Further, through comparison between Example 1 and Example 2, it may be found that as the absolute value of the DC voltage applied to the upper electrode increases, the average value of LER of the trench hole H and the deviation $(3\sigma)$ of LER are further decreased. It is thought that this is because as the absolute value of the DC voltage applied to the upper electrode increases, the effect on the modification of the mask layer M or the removal of excess fluorine atoms is increased, and then the mask layer M is suppressed from being damaged by the etching process.

In the above embodiment, in order to draw ion components within plasma into the substrate W, bias RF power is supplied from the second RF generator $31b$ to the substrate support 11. Instead of the bias RF power, electrical bias other than the RF power may be supplied to the substrate support 11. Here, the electrical bias may be a pulse-type voltage that is supplied from a pulse power supply such that an ON period and an OFF period are periodically repeated (the above-described ON/OFF control), or may be a voltage that is supplied such that the high level (High period) of the absolute value of the voltage value and the low level (Low period) are periodically repeated (the above-described High-Low control). The pulse power supply may be configured such that the power source itself supplies pulsed waves, or may include a device for pulsing the voltage, on the downstream side of the pulse power supply. As an example, the electrical bias is supplied to the lower electrode such that a negative potential is generated on the substrate W. More specifically, in the case of the High-Low control, both the high level and the low level have negative values. The electrical bias may be a negative DC voltage pulse supplied from the first DC generator $32a$. The electrical bias may be a square wave pulse, a triangular wave pulse, or an impulse, or may have other voltage waveforms.

The frequency of the electrical bias may be 1 kHz to 10 kHz, like the bias RF power.

Further, the magnitude of the electrical bias is adjusted such that the average energy of ions entering the etching target layer E becomes approximately the same as that in the bias RF power. As an example, the absolute value of the magnitude of the electrical bias is controlled to be 7 kV to 20 kV. If the absolute value of the magnitude of the electrical bias exceeds 20 kV, there is a risk that the selectivity of the mask will be decreased.

Further, the duty ratio, which is a proportion occupied by the period (the first period) when the electrical bias is supplied, or the period when the high-level electrical bias is supplied, within one cycle (the first period+second period), is controlled to be 5% to 50%, preferably 10% to 40%, like in the bias RF power.

When the electrical bias is supplied under the above conditions, as in the case of the bias RF power, vertical components of ions entering the trench hole H may be increased, and the damage to the side wall of the trench hole H is suppressed. Thus, the LER may be improved.

In a case where the electrical bias is supplied to the substrate support 11 as well, a negative DC voltage may be periodically applied from the second DC generator 32_b_ to the upper electrode facing the substrate support 11. In this case, a first voltage is supplied during the first period when the electrical bias is applied or the high-level electrical bias is applied to the substrate support 11. Further, a second voltage is supplied during the second period when the electrical bias is not supplied or the low-level electrical bias is applied to the substrate support 11. The magnitudes of the first voltage and the second voltage may be the same as those in the above described case where the bias RF power is supplied.

According to the present disclosure, it is possible to improve the shape abnormality of an etching pattern.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
(A) providing a substrate including a silicon-containing film on a substrate support;
(B) periodically supplying, to the substrate support, bias RF power of 20 kW to 50 kW at a duty ratio of 5% to 50%; and
(C) etching the silicon-containing film by plasma generated from a processing gas containing a fluorocarbon gas and an oxygen-containing gas.

2. The etching method according to claim 1, wherein the bias RF power is 23 kW to 40 KW.

3. The etching method according to claim 1, wherein the duty ratio of the bias RF power is 10% to 40%.

4. The etching method according to claim 1, wherein the silicon-containing film includes a first region having a multilayer film in which at least two of films selected from the group consisting of a silicon oxide film, a silicon nitride film, and a polysilicon film are stacked, and a second region having a single-layer film of a silicon oxide film.

5. The etching method according to claim 4, wherein (C) includes:
(C1) etching the silicon-containing film by plasma generated from a first processing gas containing a fluorocarbon gas, a hydrofluorocarbon gas, and an oxygen-containing gas, in which a flow rate ratio of the fluorocarbon gas to the oxygen-containing gas is larger than 1.0; and
(C2) etching the silicon-containing film by plasma generated from a second processing gas containing a fluorocarbon gas, a hydrofluorocarbon gas, and an oxygen-containing gas, in which a flow rate ratio of the fluorocarbon gas to the oxygen-containing gas is 1.0 or less.

6. The etching method according to claim 5, wherein a flow rate ratio of the fluorocarbon gas to the hydrofluorocarbon gas in the first processing gas is larger than a flow rate ratio of the fluorocarbon gas to the hydrofluorocarbon gas in the second processing gas.

7. The etching method according to claim 5, wherein a cycle including (C1) and (C2) is performed once or more.

8. The etching method according to claim 5, wherein a ratio of a processing time in (C2) to a processing time in (C1) is 2 to 3.

9. The etching method according to claim 1, wherein the silicon-containing film includes a first region having a multilayer film in which a silicon oxide film and a silicon nitride film are alternately stacked, and a second region having a single-layer film of a silicon oxide film.

10. The etching method according to claim 1, further comprising (D) applying a negative DC voltage to an upper electrode facing the substrate support.

11. The etching method according to claim 10, wherein (D) includes:
(D1) applying a first voltage to the substrate support during a first period when the bias RF power or the electrical bias is supplied; and
(D2) applying a second voltage having a different absolute value from the first voltage to the substrate support during a second period when the bias RF power or the electrical bias is not supplied.

12. The etching method according to claim 11, wherein the absolute value of the second voltage is larger than the absolute value of the first voltage.

13. The etching method according to claim 12, wherein the absolute value of the first voltage is 250 V to 500 V, and the absolute value of the second voltage is 1,000 V or more.

14. The etching method according to claim 1, wherein a patterned mask layer containing carbon or boron is provided on the silicon-containing film.

15. An etching method comprising:
(A) providing a substrate including a silicon-containing film on a substrate support;
(B) supplying, to the substrate support, electrical bias of 7 kV to 20 kV at a duty ratio of 5% to 50%; and
(C) etching the silicon-containing film by plasma generated from a processing gas containing a fluorocarbon gas and an oxygen-containing gas.

16. The etching method according to claim 15, wherein the duty ratio of the electrical bias is 10% to 40%.

* * * * *